(12) United States Patent
Chuang et al.

(10) Patent No.: US 11,175,579 B2
(45) Date of Patent: Nov. 16, 2021

(54) RETICLE POD

(71) Applicant: GUDENG PRECISION INDUSTRIAL CO., LTD., New Taipei (TW)

(72) Inventors: Chia-Ho Chuang, New Taipei (TW); Hsin-Min Hsueh, New Taipei (TW); Yu-Chen Chu, New Taipei (TW); Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 82 days.

(21) Appl. No.: 16/876,149

(22) Filed: May 18, 2020

(65) Prior Publication Data
US 2021/0294206 A1  Sep. 23, 2021

(30) Foreign Application Priority Data
Mar. 19, 2020  (TW) .................................. 109109151

(51) Int. Cl.
*G03F 1/66* (2012.01)

(52) U.S. Cl.
CPC ...................................... *G03F 1/66* (2013.01)

(58) Field of Classification Search
CPC . G03F 1/66; A45C 13/10; A45C 11/16; Y10S 292/11; Y10S 292/38; Y10S 292/42; Y10S 292/48; Y10S 292/50; E05C 1/00; E05C 1/004; E05C 1/04; E05C 19/06; Y10T 292/0817; Y10T 292/0894; Y10T 292/0902; Y10T 292/0903; Y10T 292/20; Y10T 292/42; Y10T 292/432; Y10T 292/438
USPC ......... 206/454, 1.5, 710, 723; 220/326, 835, 220/324
See application file for complete search history.

(56) References Cited

U.S. PATENT DOCUMENTS

| | | | | |
|---|---|---|---|---|
| 3,240,039 | A | * | 3/1966 | Baermann ........... E05B 65/5238 70/71 |
| 4,576,307 | A | * | 3/1986 | Frydenberg ............... A45C 5/00 190/117 |
| 5,988,387 | A | * | 11/1999 | Staal .................... B65D 43/165 206/1.5 |

(Continued)

*Primary Examiner* — J. Gregory Pickett
*Assistant Examiner* — Jenine Pagan

(57) ABSTRACT

A reticle pod includes a body, cover, sliding-rail member, sliding-fastening member and shut-corresponding element. The sliding-rail member has a dent portion and a slot portion and defines a locked direction. The dent portion extends from the slot portion in the locked direction. The sliding-fastening member is slidably disposed at the sliding-rail member. The sliding-fastening member has a fastening portion and resilient arms. The resilient arms are inserted into a slot of the slot portion. The fastening portion has a fastening groove corresponding in height to the slot portion. An oblique-guide surface is disposed above the fastening groove. When the cover switches from an open state to a closed state, the shut-corresponding element pushes the sliding-fastening member across the oblique-guide surface and thus compresses the sliding-fastening member, allowing the shut-corresponding element to enter the fastening groove. Then, the resilient arms releases resilient potential energy whereby the sliding-fastening member rebounds.

11 Claims, 13 Drawing Sheets

(56) References Cited

U.S. PATENT DOCUMENTS

| | | | | |
|---|---|---|---|---|
| 6,367,639 | B1* | 4/2002 | Mar | B65D 50/066 |
| | | | | 215/211 |
| 6,698,609 | B2* | 3/2004 | Pangerc | B25H 3/023 |
| | | | | 206/379 |
| 7,322,470 | B2* | 1/2008 | Brunson | B25H 3/003 |
| | | | | 206/372 |
| 7,537,117 | B2* | 5/2009 | Roesler | B25H 3/003 |
| | | | | 206/1.5 |
| 7,641,071 | B2* | 1/2010 | Wu | G03F 1/66 |
| | | | | 220/786 |
| 8,579,147 | B2* | 11/2013 | Dubois | B65D 11/1833 |
| | | | | 220/666 |
| 9,120,605 | B1* | 9/2015 | Mar | B65D 50/06 |
| 9,764,878 | B2* | 9/2017 | Semer | B65D 43/16 |
| 10,244,840 | B2* | 4/2019 | Zhu | B65D 1/22 |
| 2003/0146213 | A1* | 8/2003 | Kellerer | B65D 11/24 |
| | | | | 220/7 |
| 2006/0091032 | A1* | 5/2006 | Tsai | A45C 13/28 |
| | | | | 206/373 |
| 2019/0208880 | A1* | 7/2019 | Zhu | A45C 13/10 |

* cited by examiner

RETICLE POD

CROSS-REFERENCE TO RELATED APPLICATION

This non-provisional application claims priority under 35 U.S.C. § 119(a) on Patent Application No(s). 109109151 filed in Taiwan, R.O.C. on Mar. 19, 2020, the entire contents of which are hereby incorporated by reference.

BACKGROUND OF THE INVENTION

1. Field of the Invention

The present disclosure relates to reticle pods, and in particular to a fastenable reticle pod.

2. Description of the Related Art

Advanced lithography, especially extreme ultraviolet (EUV) lithography, has a very strict requirement for cleanliness of process environments. Particle-related contamination of reticles and poor protection for reticles cause defects thereto. The solution to meeting the strict requirement for cleanliness lies in reticle pods—reticle pods shut out dust. Conventional reticle pods are each equipped with a fastener whereby upper and lower lids of the conventional reticle pod are locked together and thus cannot open unexpectedly. However, the fasteners must be manipulated by hand in order to be locked. Another disadvantage of the conventional reticle pods is that if users shut the conventional reticle pods but forget to lock their fasteners, the conventional reticle pods can still be easily opened, leading to intrusion of dust into the conventional reticle pods and thus resultant contamination of reticles therein.

BRIEF SUMMARY OF THE INVENTION

An objective of the present disclosure is to provide a fastenable reticle pod.

To achieve at least the above objective, the present disclosure provides a reticle pod, comprising: a body opening upward; a cover opening downward, wherein a first side of the cover and a first side of the body are pivotally connected and shut against each other to define a storage space for receiving a reticle; at least one sliding rail member disposed on an opposing second side of the body and having a dent portion and a slot portion, wherein a locked direction is defined along the second side of the body, the dent portion extending from the slot portion in the locked direction and being of a lower height than the slot portion, and the slot portion having a slot; at least one sliding fastening member slidably disposed at the sliding rail member and having a fastening portion and a resilient arm, the resilient arm extending from the fastening portion in a direction opposite to the locked direction and being inserted into the slot, the fastening portion having a fastening groove corresponding in height to the slot portion, wherein an oblique guide surface is disposed above an opening position of the fastening groove; and at least one shut corresponding element disposed on a second side of the cover and corresponding in position to the dent portion, wherein, when the cover switches from open state to closed state relative to the body, the shut corresponding element pushes the sliding fastening member across the oblique guide surface to allow the sliding fastening member to move from a free position to a pressed position and thereby allow the resilient arm to be compressed, and then the shut corresponding element passes the oblique guide surface so as to enter the fastening groove, such that the resilient arm releases resilient potential energy, thereby allowing the sliding fastening member to return to the free position, wherein, when the cover is in the closed state relative to the body, the sliding fastening member moves from the free position in the locked direction to a locked position under an applied force, such that the dent portion and the shut corresponding element are in the fastening groove.

In an embodiment of the present disclosure, the shut corresponding element passes the oblique guide surface and thereby enters the fastening groove, wherein an end portion at a first end of the shut corresponding element and the fastening portion interfere with each other.

In an embodiment of the present disclosure, a blocking portion is disposed at an opposing second end of the shut corresponding element.

In an embodiment of the present disclosure, the reticle pod further comprises a resilient member disposed between the body and the cover, wherein the stored resilient potential energy of the resilient member enables the cover to switch to open state when the sliding fastening member moves from the locked position to the pressed position.

In an embodiment of the present disclosure, the slot opens upward.

In an embodiment of the present disclosure, the resilient arm has an insertion end and a resilient portion, the resilient portion connecting the insertion end and the fastening portion, and the insertion end being inserted into the slot.

In an embodiment of the present disclosure, the sliding fastening member has two resilient arms symmetrical to each other, and the two resilient arms are inserted into the slot from upper and lower ends of the slot portion of the sliding rail member, respectively.

In an embodiment of the present disclosure, the sliding fastening member has a mirror-symmetry axis parallel to the locked direction.

In an embodiment of the present disclosure, an outer surface of the fastening portion is convex.

In an embodiment of the present disclosure, the reticle pod further comprises a bush member and an axle, the bush member being disposed on the first side of the body, the axle being disposed on the first side of the cover and having a rotating neck and a head, the head being eccentrically connected to the rotating neck, wherein the bush member has a penetrating hole corresponding in shape to the head, and the axle penetrates the penetrating hole.

Therefore, a user can press the cover downward against the body, such that the resilience of the sliding fastening member enables the sliding fastening member to return to the free position and thus lock the cover and the body together to a certain extent. Even if the user forgets to move the sliding fastening member to the locked position, the sliding fastening member can still prevent the reticle pod from being opened and thus prevent the reticle stored therein from being contaminated by dust. Therefore, the reticle pod of the present disclosure not only manifests enhanced safety and ease of use but also reduces the likelihood of mistakes which might otherwise incur manufacturing cost.

DETAILED DESCRIPTION OF THE INVENTION

To facilitate understanding of the object, characteristics and effects of this present disclosure, embodiments together with the attached drawings for the detailed description of the present disclosure are provided.

Figure 1:
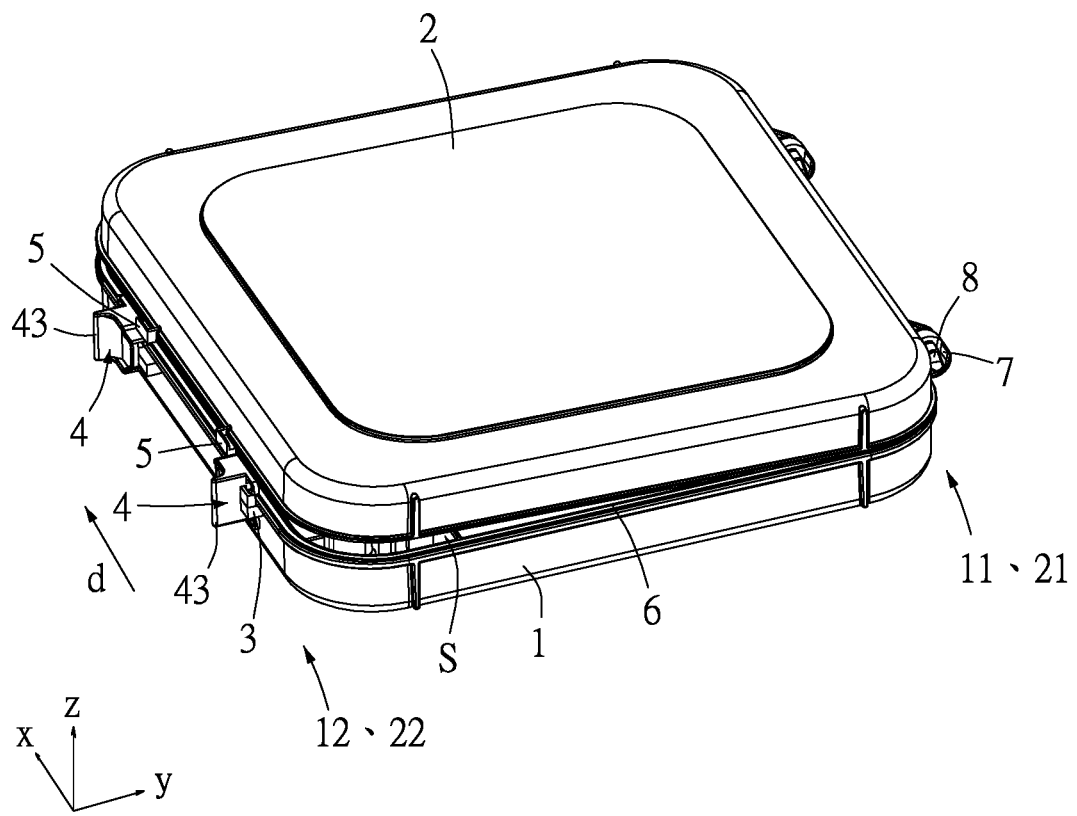
FIG. 1 is a perspective view of a reticle pod according to an embodiment of the present disclosure.
Figure 2:
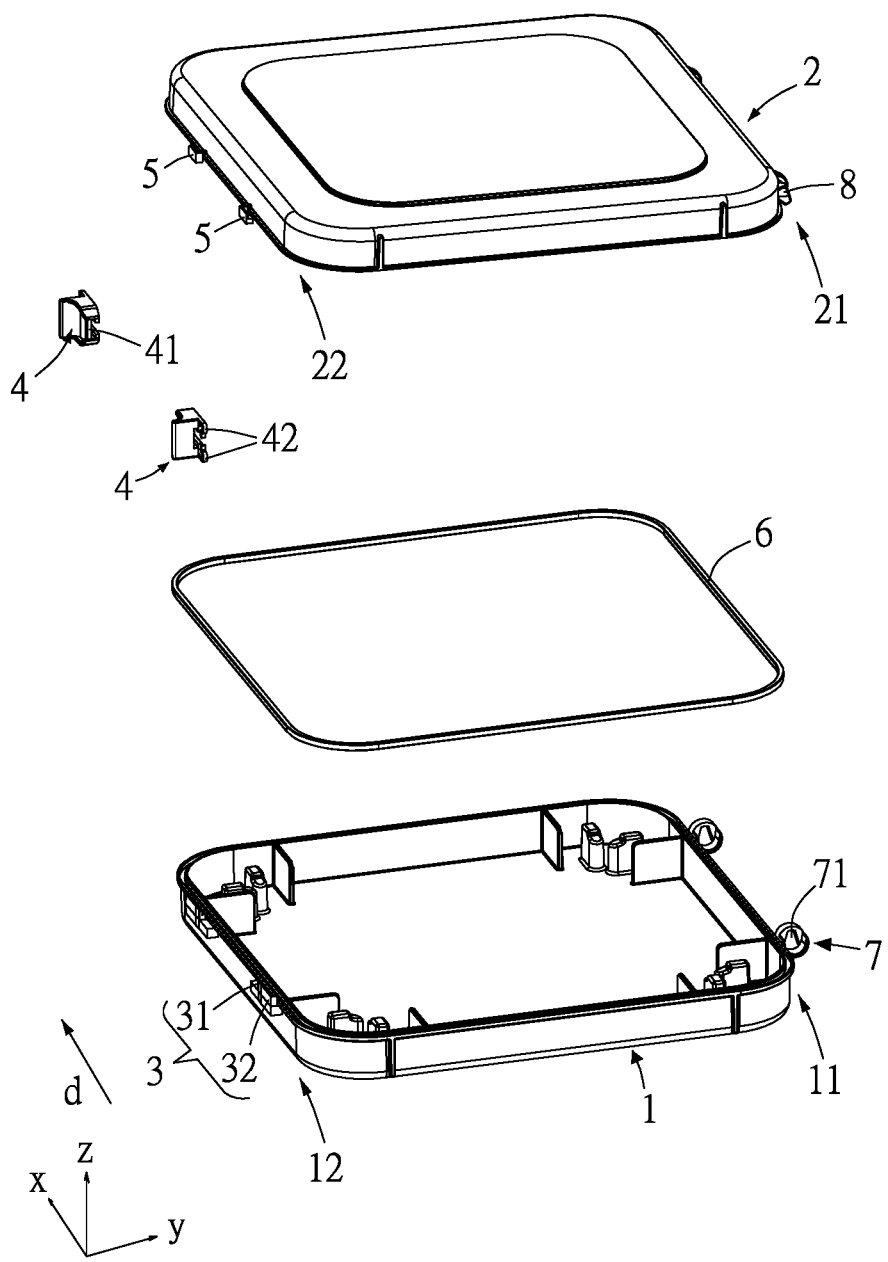
FIG. 2 is an exploded view of the reticle pod according to the embodiment of the present disclosure.

Referring to FIG. 1 and FIG. 2, in an embodiment of the present disclosure, a reticle pod 100 comprises a body 1, a cover 2, at least one sliding rail member 3, at least one sliding fastening member 4 and at least one shut corresponding element 5.

The body 1 opens upward and has therein a reticle placement region for a reticle (not shown).

The cover 2 opens downward and shuts against the body 1. A first side 21 of the cover 2 and a first side 11 of the body 1 are pivotally connected and shut against each other to define a storage space S for receiving the reticle.

Figure 3:
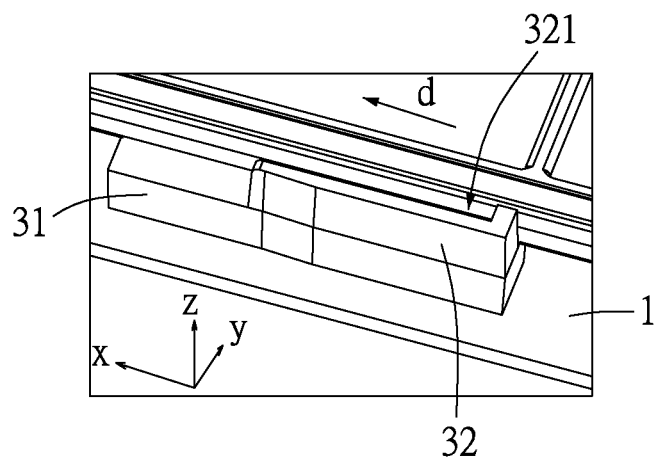
FIG. 3 is a schematic view of a sliding rail member according to the embodiment of the present disclosure.
Figure 4:
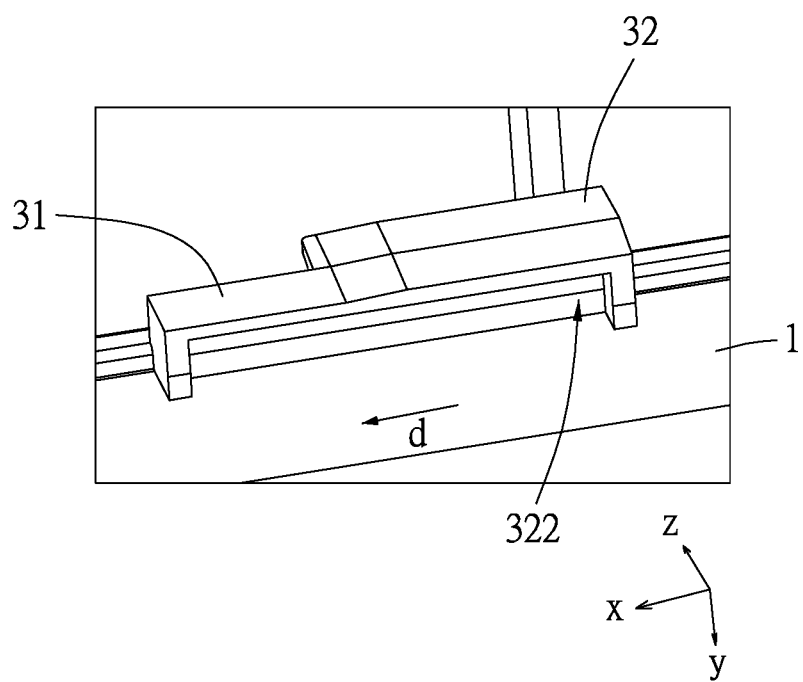
FIG. 4 is a schematic view of the sliding rail member from another angle according to the embodiment of the present disclosure.

Referring to FIG. 2 and FIG. 3, the sliding rail member 3 is disposed on a second side 12 of the body 1. The second side 12 is opposite the first side 11. The sliding rail member 3 has a dent portion 31 and a slot portion 32. A locked direction d is defined along the second side 12. The dent portion 31 extends from the slot portion 32 and in the locked direction d. The dent portion 31 is lower than the slot portion 32. The slot portion 32 has a slot 321.

Figure 5:
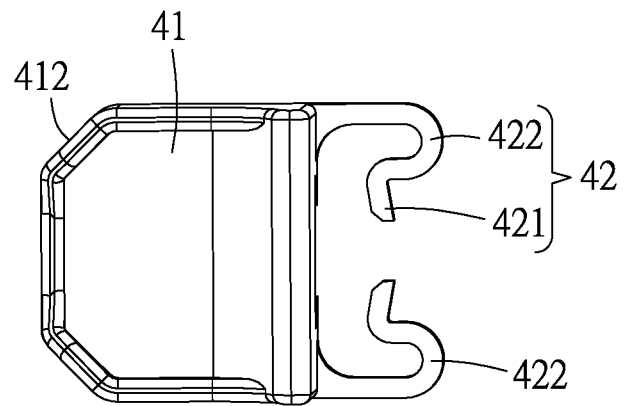
FIG. 5 is a perspective view of a sliding fastening member according to the embodiment of the present disclosure.
Figure 6:
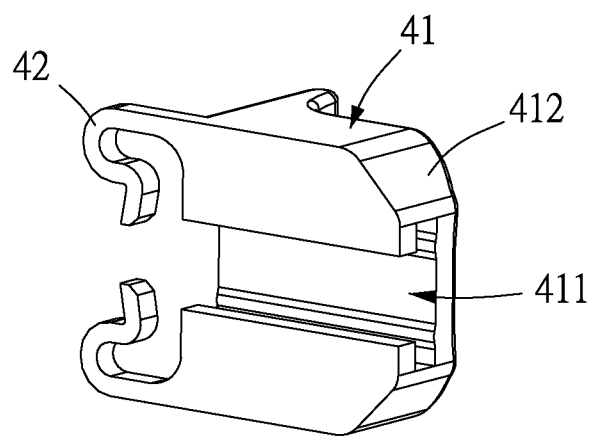
FIG. 6 is a schematic view of the sliding fastening member from another angle according to the embodiment of the present disclosure.
Figure 7:
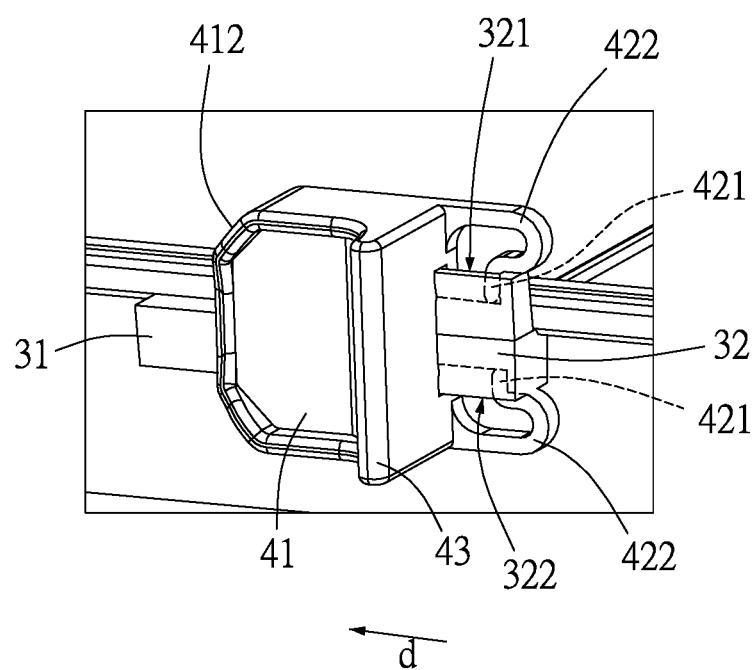
FIG. 7 is a schematic view of the sliding fastening member mounted on the sliding rail member according to the embodiment of the present disclosure.

Referring to FIG. 5 through FIG. 7, the sliding fastening member 4 is slidably disposed at the sliding rail member 3. The sliding fastening member 4 has a fastening portion 41 and a resilient arm 42. The resilient arm 42 extends from the fastening portion 41 in a direction opposite to the locked direction d. The resilient arm 42 is inserted into the slot 321. The fastening portion 41 has a fastening groove 411 corresponding in height to the slot portion 32. The fastening portion 41 has an oblique guide surface 412 above the opening position of the fastening groove 411.

Figure 8:
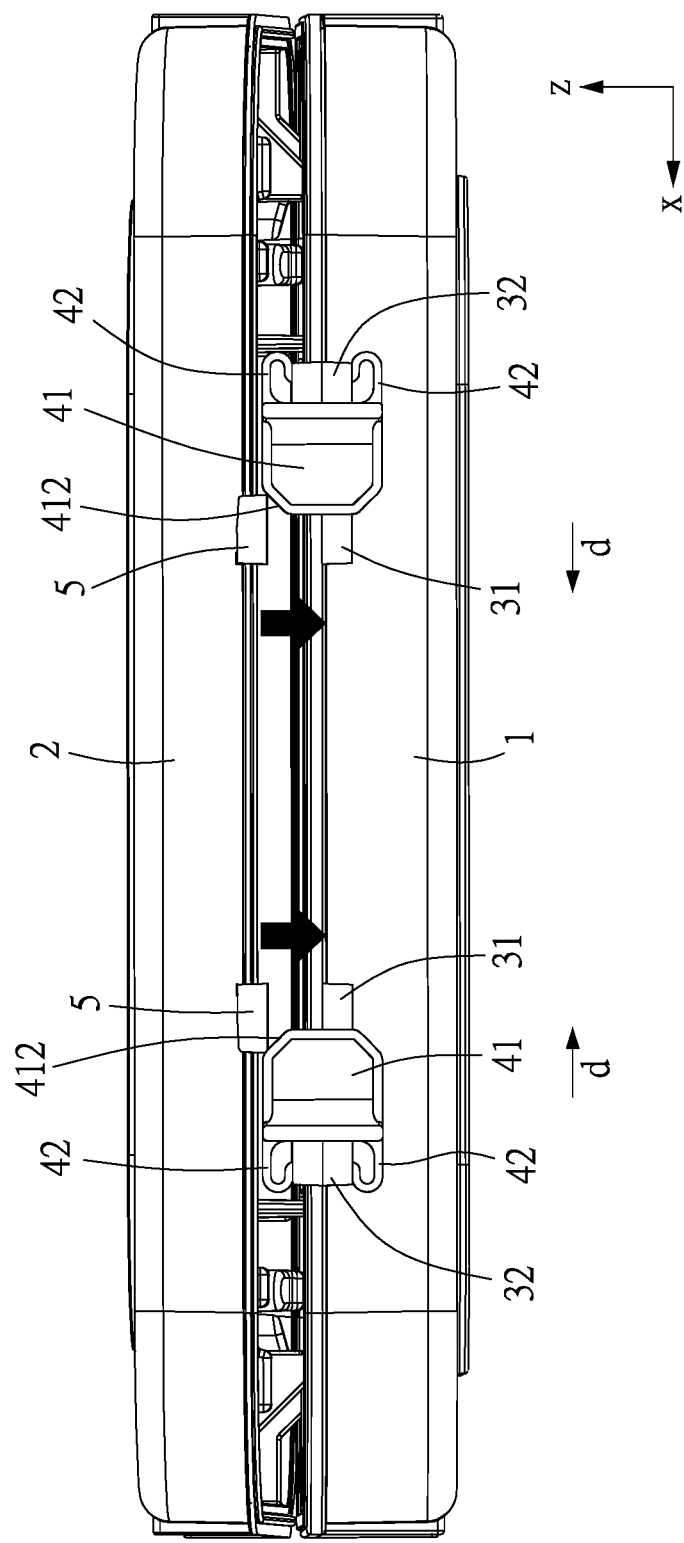
FIG. 8 is a schematic view of the sliding fastening member at a free position according to the embodiment of the present disclosure.

Referring to FIG. 1, FIG. 2 and FIG. 8, the shut corresponding element 5 is disposed on the second side 22 of the cover 2 and corresponds in position to the dent portion 31.

The description below is about how to fasten the reticle pod 100.

Figure 9:
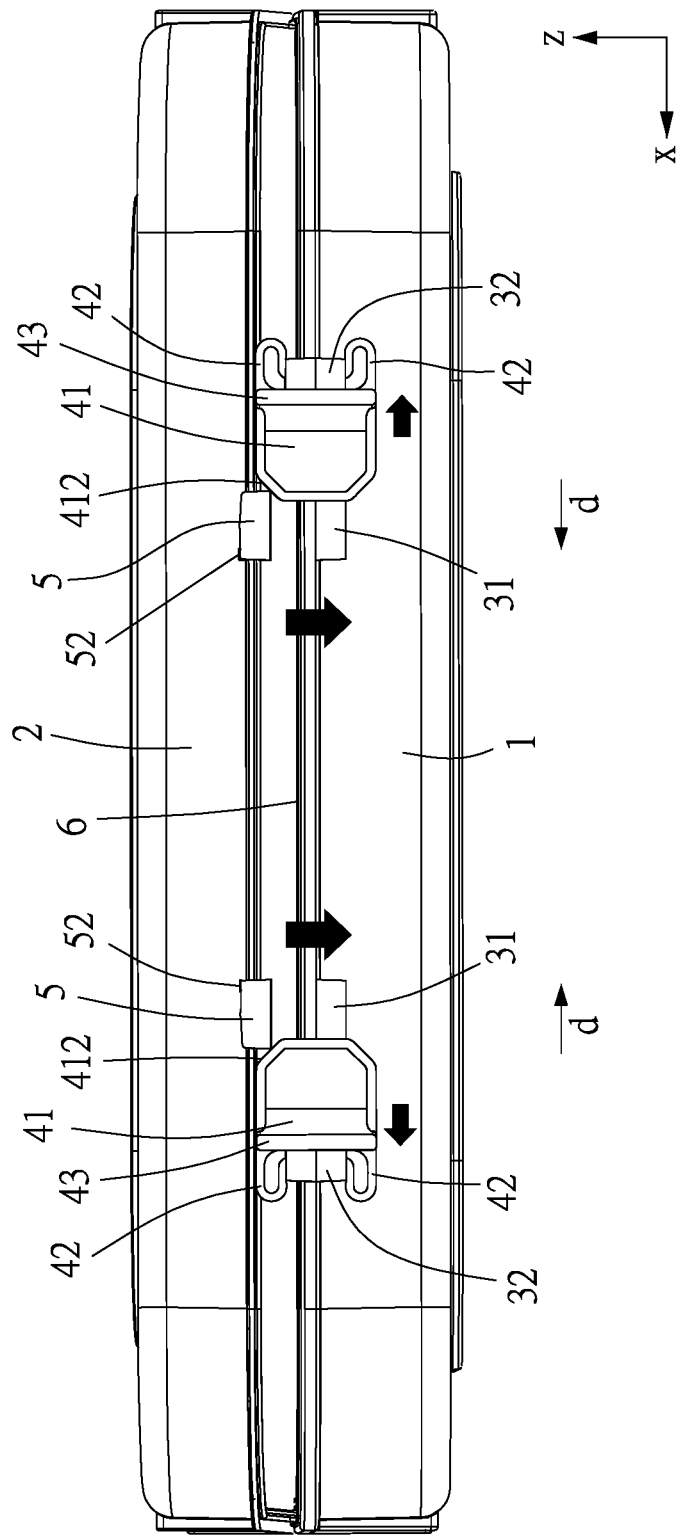
FIG. 9 is a schematic view of the sliding fastening member at a pressed position according to the embodiment of the present disclosure.

When the cover 2 and the body 1 rotate pivotally relative to each other about the first sides 11, 21, the cover 2 switches from an open state to a closed state relative to the body 1. Referring to FIG. 8, the closing process entails pressing the cover 2 downward, such that the shut corresponding element 5 abuts against the oblique guide surface 412 of the sliding fastening member 4. Referring to FIG. 9, when the cover 2 is pressed downward further, the shut corresponding element 5 pushes the sliding fastening member 4 along the oblique guide surface 412, such that the sliding fastening member 4 switches from a free position shown in FIG. 8 to a pressed position shown in FIG. 9 (in a direction opposite to the locked direction) so as for the resilient arm 42 to be compressed. During this process, the resilient arm 42 accumulates resilient potential energy.

Figure 10:
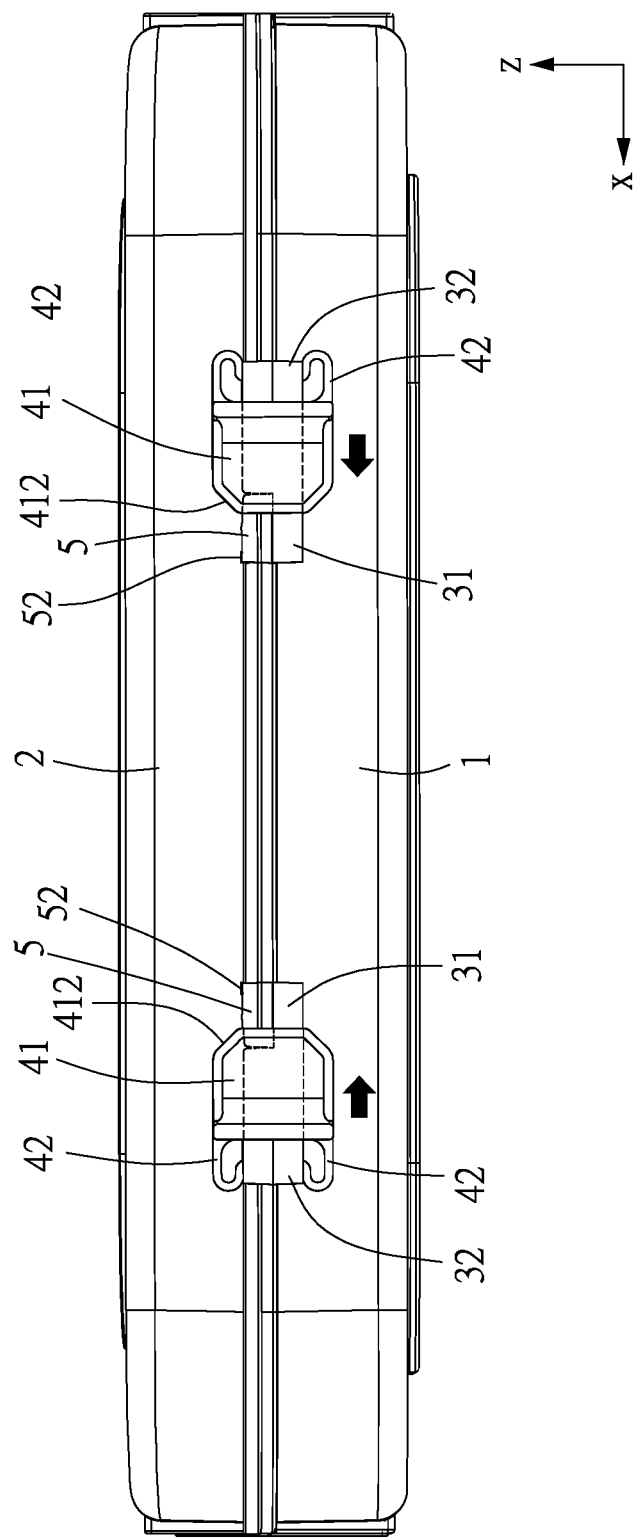
FIG. 10 is a schematic view of a shut corresponding element which has entered a fastening groove according to the embodiment of the present disclosure.
Figure 11A:
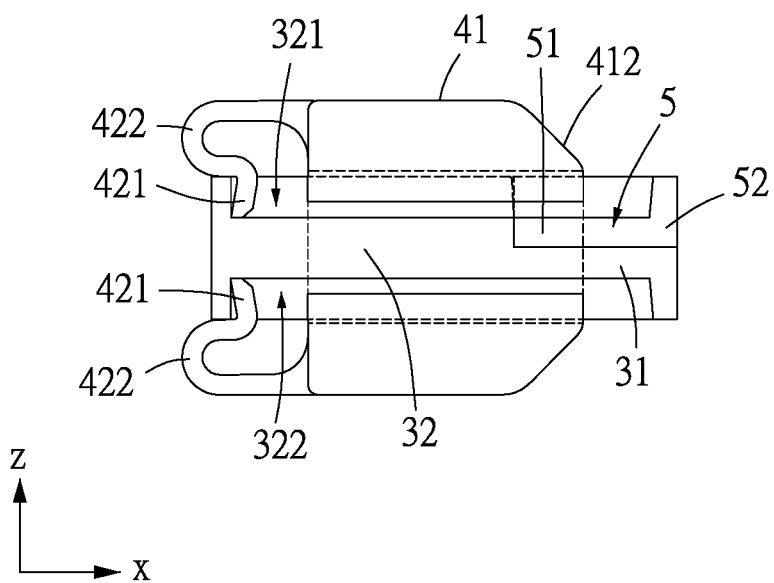
FIG. 11A is a schematic view of how a first end of the shut corresponding element and a fastening portion interfere with each other according to the embodiment of the present disclosure.

Referring to FIG. 10 and FIG. 11A, the shut corresponding element 5 moves downward continuously until it passes the oblique guide surface 412 and thus enters the fastening groove 411 (see FIG. 6). Upon its entry into the fastening groove 411, the shut corresponding element 5 stops pushing the sliding fastening member 4; consequently, the resilient arm 42 releases resilient potential energy immediately, such that the sliding fastening member 4 switches from a compression position (shown in FIG. 9) to the free position (shown in FIG. 10). Referring to FIG. 11A, in this embodiment, the end portion 51 at a first end of the shut corresponding element 5 and the fastening portion 41 interfere with each other in the open direction of the cover 2. Therefore, even if a user forgets to lock the cover 2 and the body 1 together, the reticle pod 100 will still have a certain degree of fastening capability and thus can prevent the reticle pod 100 from opening unexpectedly.

Figure 11B:
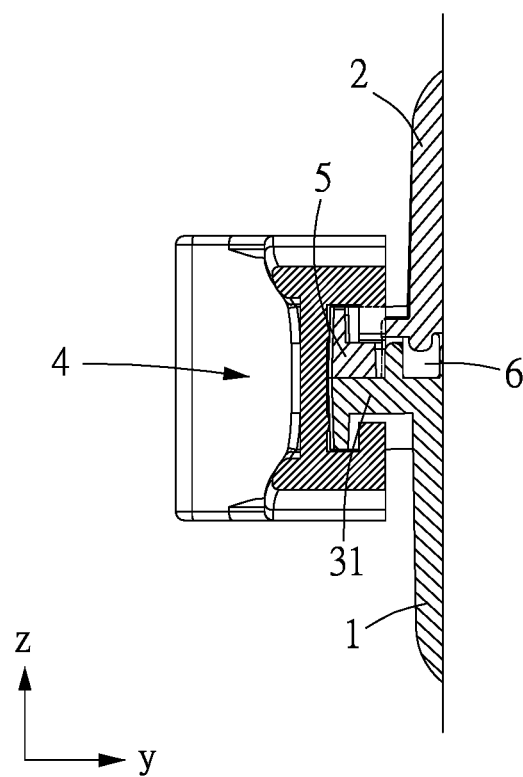
FIG. 11B is a cross-sectional view of the shut corresponding element which has entered the fastening groove according to the embodiment of the present disclosure.
Figure 12:
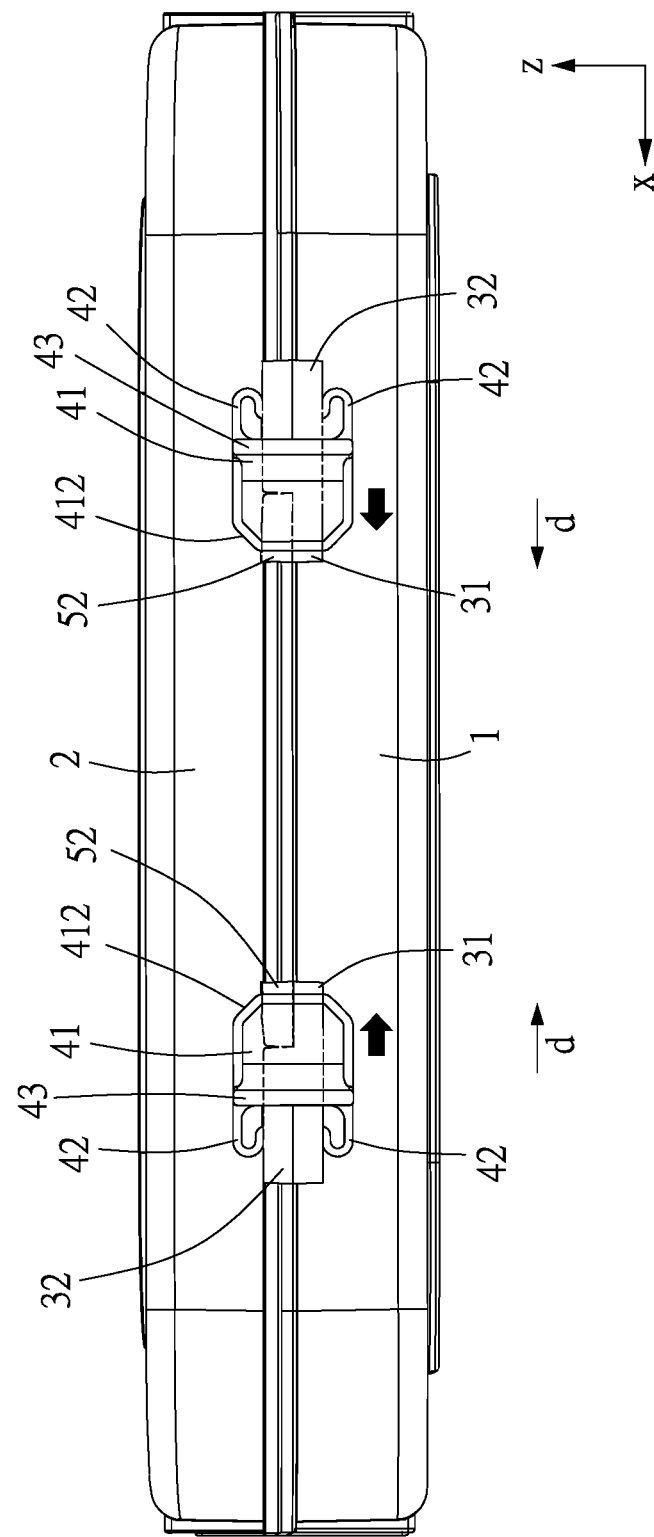
FIG. 12 is a schematic view of the sliding fastening member at a locked position according to the embodiment of the present disclosure.

Referring to FIG. 12, when the cover 2 is in the closed state relative to the body 1, the sliding fastening member 4 switches from the free position of FIG. 10 to a locked position in the locked direction d under an applied force. At the locked position, the dent portion 31 and the shut corresponding element 5 are in the fastening groove 411. Referring to FIG. 11B, the shut corresponding element 5 and dent portion 31 pass through the fastening groove 411, such that the sliding fastening member 4 slides to the shut corresponding element 5 and dent portion 31 (i.e., the locked position), not only because the overall height of the shut corresponding element 5 and dent portion 31 is substantially equal to the height of the slot portion 32, but also because the fastening groove 411 of the sliding fastening member 4 corresponds in height to the slot portion 32.

The reticle pod 100 of the present disclosure is capable of switching between the free position, the pressed position and the locked position. A user presses the cover 2 downward against the body 1, such that the resilience of the sliding fastening member 4 enables the sliding fastening member 4 to return to the free position and thus lock the cover 2 and the body 1 together to a certain extent. Even if the user forgets to move the sliding fastening member 4 to the locked position, the sliding fastening member 4 can still prevent the reticle pod 100 from being opened and thus prevent the reticle stored therein from being contaminated by dust. Therefore, the reticle pod of the present disclosure not only manifests enhanced safety and ease of use but also reduces the likelihood of mistakes which might otherwise incur manufacturing cost.

Referring to FIG. 12, a blocking portion 52 is disposed at a second end of the shut corresponding element 5, and the second end is opposite the first end. The blocking portion 52 is connected to the cover 2. Therefore, after having slid to the blocking portion 52, the sliding fastening member 4 is blocked by the blocking portion 52 and thus stops at a fastening position.

Referring to FIG. 1 and FIG. 2, the reticle pod 100 further comprises a resilient member 6 disposed between the body 1 and the cover 2. The resilient member 6 stores resilient potential energy whereby the cover 2 springs upward automatically when opened. When the cover 2 switches from the open state to the closed state relative to the body 1, the resilient member 6 is compressed and thus stores resilient potential energy. To open the reticle pod 100, the user disables the locked position of the sliding fastening member 4 by hand. Under an applied force, the sliding fastening member 4 moves from the locked position of FIG. 12 to the pressed position of FIG. 9, such that the first end of the shut corresponding element 5 no longer interferes with the fastening portion 41. At this moment, the resilient member 6 releases the stored resilient potential energy to cause the cover 2 to spring upward and rotate pivotally, such that the cover 2 switches to the open state relative to the body 1. Since the cover 2 springs upward, the shut corresponding element 5 no longer pushes the sliding fastening member 4, and the sliding fastening member 4 at the pressed position returns to the free position shown in FIG. 8 when driven by the resilient potential energy released by the resilient arm 42.

Referring to FIG. 3 through FIG. 7, the slot 321 of the slot portion 32 opens upward. The resilient arm 42 has an insertion end 421 and a resilient portion 422. The resilient portion 422 connects the insertion end 421 and the fastening portion 41. The insertion end 421 is inserted into the slot 321.

In this embodiment, the slot portion 32 has two slots 321, 322, with one above the other. The two slots 321, 322 are in communication with each other or are not in communication with each other. The sliding fastening member 4 has two resilient arms 42 which are symmetrical to each other. The two resilient arms 42 are inserted into the slots 321, 322 from the upper and lower ends of the slot portion 32, respectively. With the resilient portion 422 being arcuate, the insertion end 421 can catch the slots 321, 322. Therefore, although the resilient portion 422 releases resilient potential energy, the sliding fastening member 4 does not separate from the sliding rail member 3.

Referring to FIG. 1 and FIG. 7, in this embodiment, the sliding fastening member 4 has an operating portion 43 which extends from the fastening portion 41 in a direction perpendicular to the locked direction d. The operating portion 43 enables the user to push the sliding fastening member 4 conveniently and cause the sliding fastening member 4 to move to the compressed position or locked position.

Referring to FIGS. 8-10, 12, in this embodiment, the sliding rail member 3 and the sliding fastening member 4 are each in the number of two. The two sliding rail members 3 flank the second side 12 of the body 1. The two sliding fastening members 4 are disposed at the two sliding rail members 3, respectively. However, the present disclosure is not limited thereto, and thus the sliding rail member 3 and the sliding fastening member 4 are each in the number of one or in a plural number, as needed. In general, the two sliding rail members 3 and two sliding fastening members 4 are not only suitable for intuitive usage but are also tight-fitting.

Referring to FIGS. 8-10, 12, in this embodiment, the locked directions d of the two sliding fastening members 4 oppose each other (inward). However, the present disclosure is not limited thereto, and thus the two locked directions d are in the same direction (leftward or rightward) or opposite (outward).

Referring to FIGS. 8-10, 12, in this embodiment, the two sliding fastening members 4 are rotationally symmetrical to each other and each have a mirror-symmetry axis parallel to the locked direction d. Therefore, the two sliding fastening members 4 are completely identical and thus can be manufactured with the same die to thereby simplify a production process and reduce material cost.

Figure 16:
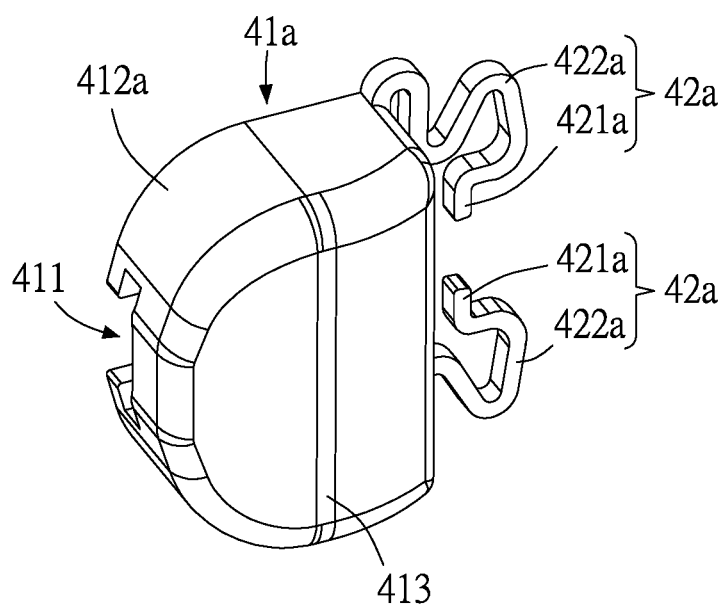
FIG. 16 is a perspective view of the sliding fastening member according to another embodiment of the present disclosure.

Referring to FIG. 16, there is shown a perspective view of the sliding fastening member 4a according to another embodiment of the present disclosure. The sliding fastening member 4a substitutes for the sliding fastening member 4. The sliding fastening member 4a is substantially identical to the sliding fastening member 4 and has a fastening portion 41a and two resilient arms 42a symmetrical to each other.

The fastening portion 41a has the fastening groove 411 and the arcuate oblique guide surface 412a. The outer surface 413 of the fastening portion 41a is convex and enables the user to push the sliding fastening member 4a conveniently to thereby cause the sliding fastening member 4a to move to the compressed position or locked position.

The resilient arms 42a each have an insertion end 421a and a resilient portion 422a. The resilient portion 422a connects the insertion end 421a and the fastening portion 41a. The two insertion ends 421a are inserted into the slots 321, 322 from the upper and lower ends of the slot portion 32, respectively. With the resilient portion 422a being arcuate, the insertion ends 421a can catch the slots 321, 322. Therefore, although the resilient portion 422a releases resilient potential energy, the sliding fastening member 4a does not separate from the sliding rail member 3.

Figure 13:
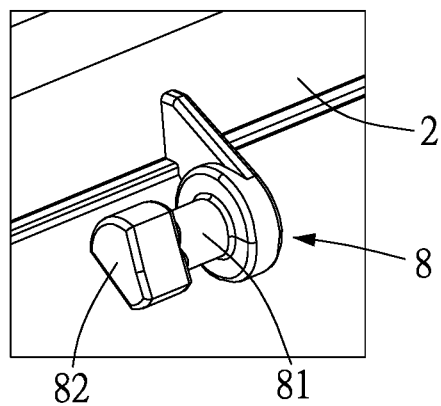
FIG. 13 is a perspective view of an axle according to the embodiment of the present disclosure.
Figure 14:
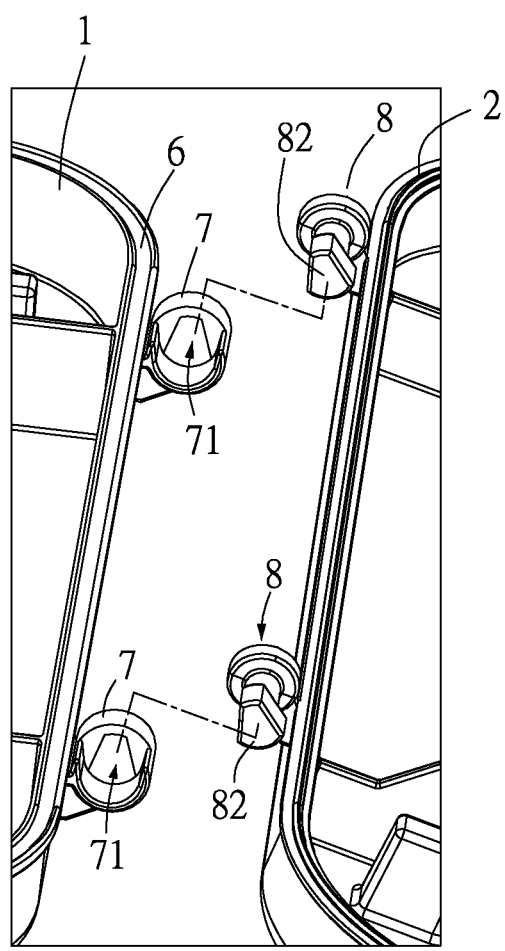
FIG. 14 is a schematic view of how to put together a bush member and the axle according to the embodiment of the present disclosure.
Figure 15:
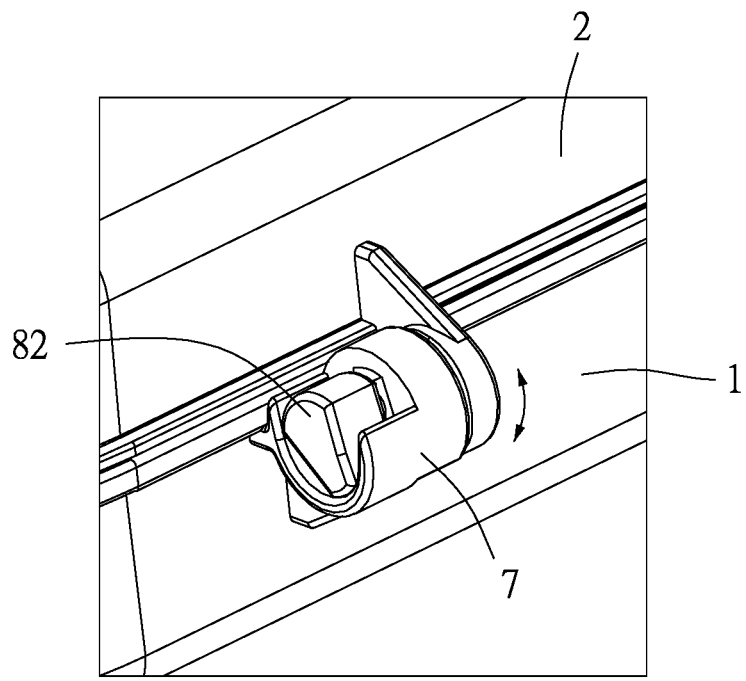
FIG. 15 is a perspective view of the bush member and axle according to the embodiment of the present disclosure.

Referring to FIG. 1, FIG. 2, FIG. 13~FIG. 15, the reticle pod 100 further comprises a bush member 7 and an axle 8. The bush member 7 is disposed on the first side 11 of the body 1. The axle 8 is disposed on the first side 21 of the cover 2. Referring to FIG. 13, the axle 8 has a rotating neck 81 and a head 82. The head 82 is eccentrically connected to the rotating neck 81. Referring to FIG. 14, the bush member 7 has a penetrating hole 71 corresponding in shape to the head 82, and the axle 8 penetrates the penetrating hole 71. Referring to FIG. 15, with the head 82 being eccentrically connected to the rotating neck 81, the head 82 and the penetrating hole 71 interfere with each other while the rotating neck 81 rotates in the bush member 7, such that the axle 8 cannot escape from the bush member 7. It is only when the cover 2 rotates relative to the body 1 by a specific angle (as shown in FIG. 14) that the head 82 will face the penetrating hole 71 exactly, thereby allowing the axle 8 to escape from the bush member 7. Owing to the foregoing technical features of the bush member 7 and axle 8, two inevitable consequences are as follows: the cover 2 and the body 1 can only be separated at a specific angle; and the cover 2 and the body 1 can only pivotally rotate relative to each other but cannot be separated, provided that their rotation does not reach the specific angle after their assembly.

While the present disclosure has been described by means of specific embodiments, numerous modifications and variations could be made thereto by those skilled in the art without departing from the scope and spirit of the present disclosure set forth in the claims.

What is claimed is:

1. A reticle pod, comprising:

a body opening upward;

a cover opening downward, wherein a first side of the cover and a first side of the body are pivotally connected and shut against each other to define a storage space for receiving a reticle;

at least one sliding rail member disposed on an opposing second side of the body and having a dent portion and a slot portion, wherein a locked direction is defined along the second side of the body, the dent portion extending from the slot portion in the locked direction and being of a lower height than the slot portion, and the slot portion having a slot;

at least one sliding fastening member slidably disposed at the sliding rail member and having a fastening portion and a resilient arm, the resilient arm extending from the fastening portion in a direction opposite to the locked direction and being inserted into the slot, the fastening portion having a fastening groove corresponding in height to the slot portion, wherein an oblique guide surface is disposed above an opening position of the fastening groove; and at least one shut corresponding element disposed on a second side of the cover and corresponding in position to the dent portion, wherein, when the cover switches from open state to closed state relative to the body, the shut corresponding element pushes the sliding fastening member across the oblique guide surface to allow the sliding fastening member to move from a free position to a pressed position and thereby allow the resilient arm to be compressed, and then the shut corresponding element passes the oblique guide surface so as to enter the fastening groove, such that the resilient arm releases resilient potential energy, thereby allowing the sliding fastening member to return to the free position, wherein, when the cover is in the closed state relative to the body, the sliding fastening member moves from the free position in the locked direction to a locked position under an applied force, such that the dent portion and the shut corresponding element are in the fastening groove.

2. The reticle pod of claim 1, wherein the shut corresponding element passes the oblique guide surface and thereby enters the fastening groove, wherein an end portion at a first end of the shut corresponding element and the fastening portion interfere with each other.

3. The reticle pod of claim 2, wherein a blocking portion is disposed at an opposing second end of the shut corresponding element.

4. The reticle pod of claim 2, further comprising a resilient member disposed between the body and the cover, wherein a stored resilient potential energy of the resilient member enables the cover to switch to open state when the sliding fastening member moves from the locked position to the pressed position.

5. The reticle pod of claim 1, wherein the slot opens upward.

6. The reticle pod of claim 1, wherein the resilient arm has an insertion end and a resilient portion, the insertion end being inserted into the slot, and the resilient portion connecting the insertion end and the fastening portion.

7. The reticle pod of claim 1, wherein the sliding fastening member has two resilient arms symmetrical to each other, and the two resilient arms are inserted into the slot from upper and lower ends of the slot portion of the sliding rail member, respectively.

8. The reticle pod of claim 1, wherein the sliding fastening member has a mirror-symmetry axis parallel to the locked direction.

9. The reticle pod of claim 7, wherein the sliding fastening member has a mirror-symmetry axis parallel to the locked direction.

10. The reticle pod of claim 1, wherein an outer surface of the fastening portion is convex.

11. The reticle pod of claim 1, further comprising a bush member and an axle, the bush member being disposed on the first side of the body, the axle being disposed on the first side of the cover and having a rotating neck and a head, the head being eccentrically connected to the rotating neck, wherein the bush member has a penetrating hole corresponding in shape to the head, and the axle penetrates the penetrating hole.

* * * * *